(12) United States Patent
Kim et al.

(10) Patent No.: US 6,215,691 B1
(45) Date of Patent: Apr. 10, 2001

(54) CELL STRUCTURE OF FERROELECTRIC MEMORY DEVICE

(75) Inventors: Duck Ju Kim, Cheju-do; Je Hoon Park, Seoul, both of (KR)

(73) Assignee: Hyundai Electronics Industries Co. Ltd., Kyoungki-do (KR)

( * ) Notice: Subject to any disclaimer, the term of this patent is extended or adjusted under 35 U.S.C. 154(b) by 0 days.

(21) Appl. No.: 09/425,030

(22) Filed: Oct. 25, 1999

(30) Foreign Application Priority Data

Oct. 28, 1998 (KR) .................................................. 98-45566

(51) Int. Cl.$^7$ .................................................. G11C 11/22
(52) U.S. Cl. ........................ 365/145; 365/189.09; 365/203
(58) Field of Search .................................. 365/145, 203, 365/149, 189.09, 205, 190

(56) References Cited

U.S. PATENT DOCUMENTS 5,917,746 * 6/1999 Seyyedy ................................ 365/145
6,034,884 * 6/1999 Jung ...................................... 365/145

* cited by examiner

*Primary Examiner*—David Nelms
*Assistant Examiner*—David Lam
(74) *Attorney, Agent, or Firm*—Nath & Associates; Gary M. Nath (57) ABSTRACT

The present invention relates to a cell structure of a ferroelectric memory device which can prevent a data loss and improve a data read/write speed, including: first and second MOS transistors connected in series between two bit lines, and performing a switching operation according to an enable state of a word line; a third MOS transistor connected between the first and second MOS transistors and a plate line, and engaged with the first and second MOS transistors according to an enable state the word line; and first and second ferroelectric capacitors connected between the first MOS transistor and the third MOS transistor, and between the second MOS transistor and the third MOS transistor, respectively, and storing data in accordance with a switching state of the first to third MOS transistors. Accordingly, the present invention can carry out a high-speed data sensing operation and a restoring operation, and can prevent the data from being lost, which results in improved speed and reliability.

7 Claims, 7 Drawing Sheets

CELL STRUCTURE OF FERROELECTRIC MEMORY DEVICE

BACKGROUND OF THE INVENTION

1. Field of the Invention

The present invention relates to a ferroelectric memory device, and in particular to an improved cell structure of a ferroelectric memory device which can prevent a data loss.

2. Description of the Background Art

Figure 1:
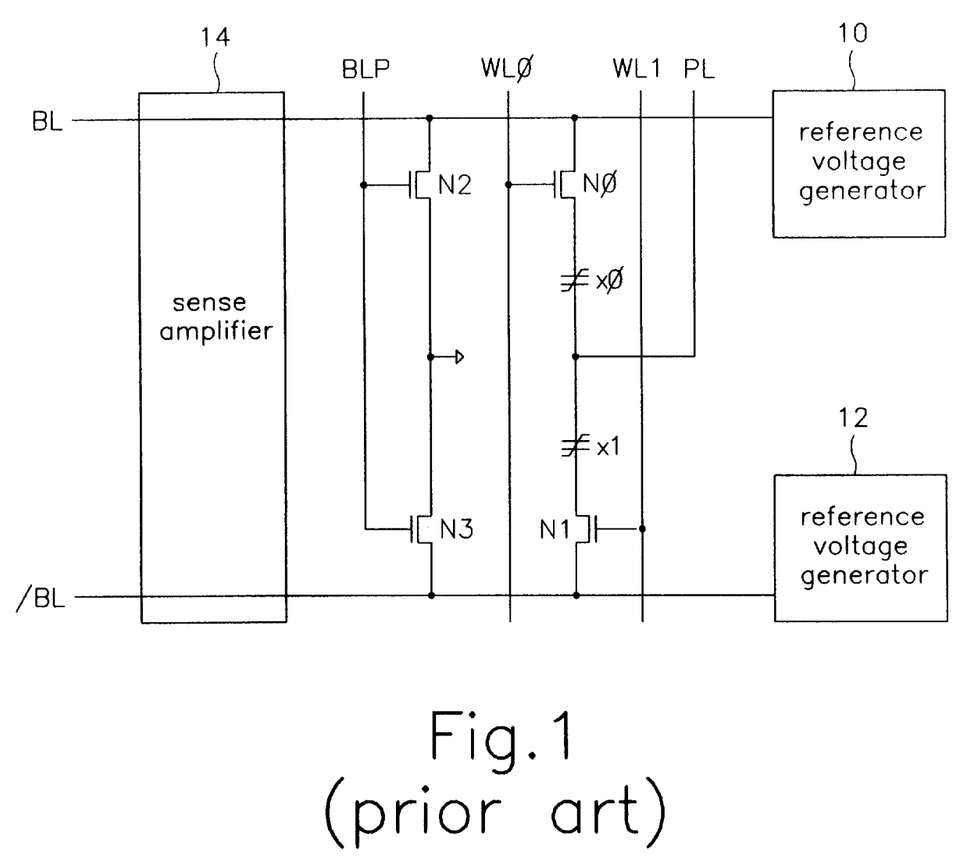
FIG. 1 is a circuit view illustrating a state where a first example of a conventional cell of a ferroelectric memory device is employed.

As illustrated in FIG. 1, a conventional ferroelectric memory cell includes a ferroelectric capacitor X0 or X1 operated as a charge storing unit, and a MOS transistor N0 or N1 for sense and read operations. Read and write operations are performed by driving a plate line PL. Here, the MOS transistor N0 is turned on according to an enable state of a word line WL0, and the MOS transistor N1 is turned on according to an enable state of a word line WL1.

Figure 2:
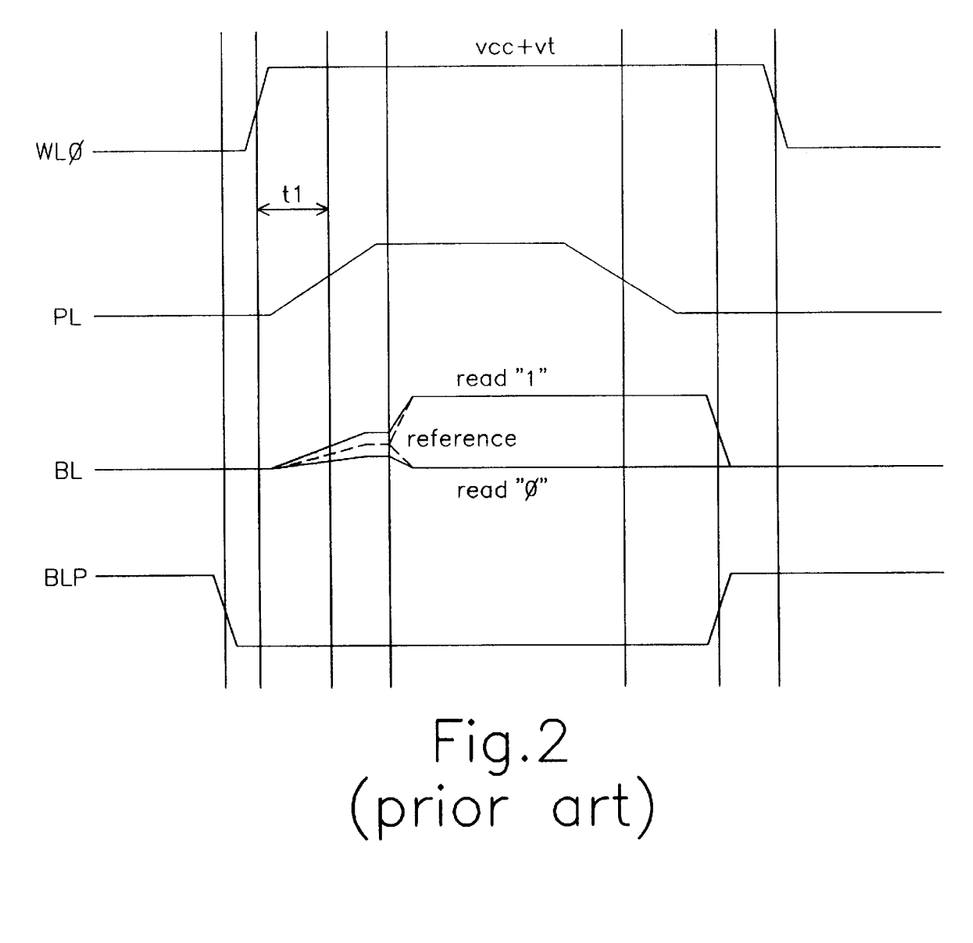
FIG. 2 is a timing view of the circuit as shown in FIG. 1.

That is, in the conventional ferroelectric memory cell, as shown in FIG. 2, a bit line precharge signal BLP is maintained at a high H level at an initial stage, and thus MOS transistors N2, N3 are turned on. As a result, a pair of bit lines BL, /BL become a ground voltage level. Thereafter, the bit line precharge signal BLP is transited from high H to low L, and thus the MOS transistors N2, N3 are turned off. Accordingly, the pair of bit lines BL, /BL are precharged to the ground voltage level. As the word line WL0 of the two word lines W0, W1 is selected and enabled at a voltage level of "Vcc+Vt", the MOS transistor N0 is turned on. When the plate line PL is transited from low to high, the bit line BL becomes a high level, and the bit line bar /BL becomes a low level. When the plate line PL become a high level, the bit line BL is increased to a voltage to be compared with a reference voltage, and thus a sense amplifier 14 senses that data "1" is currently stored. Thereafter, when the bit line precharge signal BLP is transited from low to high, the pair of bit lines BL, /BL become the ground voltage level.

In the conventional ferroelectric memory cell, the plate line PL consists of platinum Pt. A dielectric constant of the platinum is great, and thus a parasitic capacitance is also great. Accordingly, as depicted in FIG. 2, until the plate line PL is driven from low to high after the word line WL0 is selected, a predetermined delay time tl is consumed, thereby lowering a speed in reading or writing a data.

Figure 3:
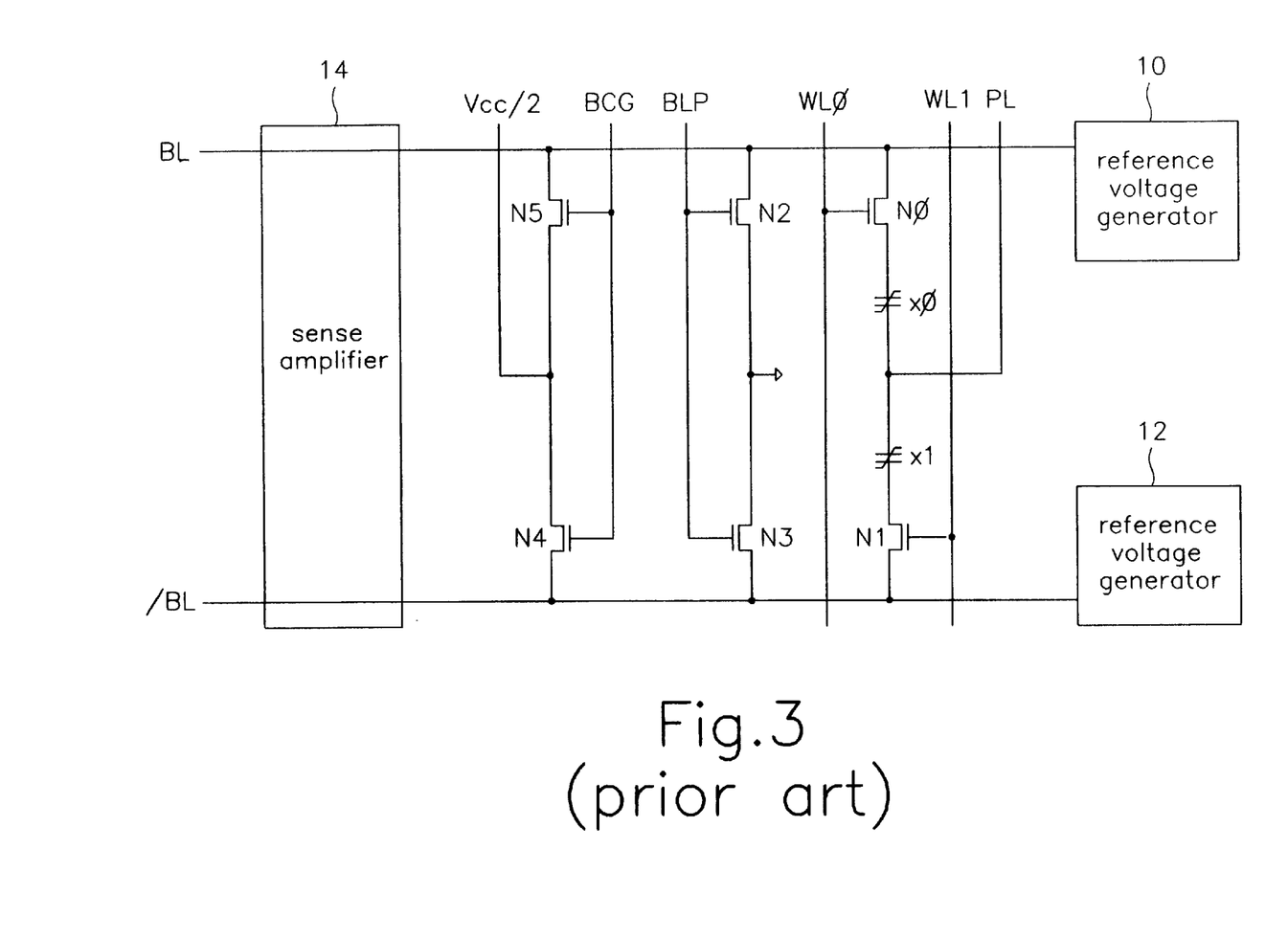
FIG. 3 is a circuit view illustrating a state where a second example of a conventional cell of a ferroelectric memory device is employed.

As illustrated in FIG. 3, in order to solve the delay time of the circuit, there has been suggested a circuit for removing a time delayed in driving the plate line PL by applying "Vcc/2" to the plate line PL.

That is, the circuit as shown in FIG. 3 further includes MOS transistors N4. N5 connected in series between the pair of bit lines BL, /BL, turned on according to a bit line half Vcc precharge signal BCG, and converting the pair of bit lines BL, /BL to a Vcc/2 state, and applies Vcc/2 to the plate line PL, differently from the circuit as shown in FIG. 1.

Figure 4:
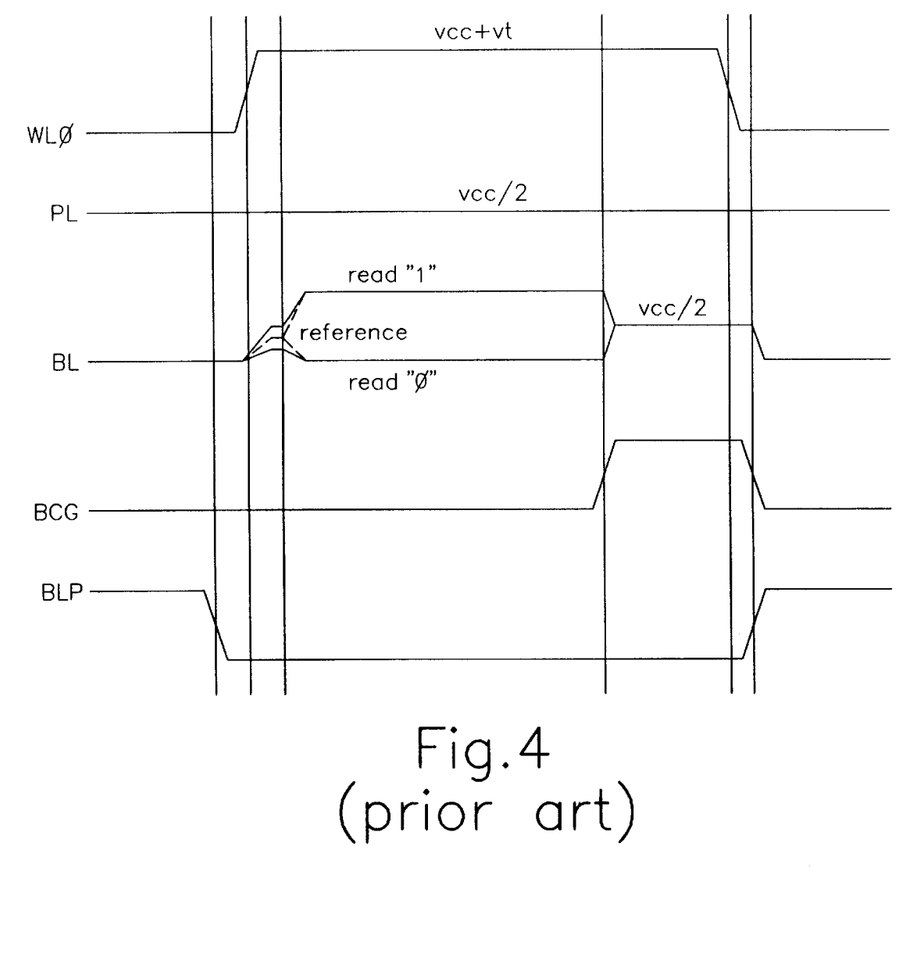
FIG. 4 is a timing view of the circuit as shown in FIG. 3.

In the case of the circuit as shown in FIG. 3, as illustrated in FIG. 4, while the data sensing operation is performed on the selected word line WL0 at a high speed, the bit line half Vcc precharge signal BCG is maintained at a low level. When the data sensing operation is finished on the word line WL0, the bit line half Vcc precharge signal BCG is transited from low to high, thereby turning on the MOS transistors N4, N5. Accordingly, the pair of bit lines BL, /BL become a Vcc/2 state, and the data is restored. Thereafter, when the bit line precharge signal BLP is transited from low to high, the MOS transistors N2, N3 are turned on, and thus the pair of bit lines BL, /BL become the ground voltage level.

However, in the operation of the circuit as shown in FIG. 3, when the selected word line WL0 is transited from high to low, the MOS transistor N0 is turned off. At this time, the Vcc/2 voltage is being applied to the plate line PL, and thus an upper electrode (a portion connected to a source of the MOS transistor N0) of the ferroelectric capacitor X0 is floated. Accordingly, a leakage is generated at the upper electrode of the ferroelectric capacitor X0, and thus the data are lost.

SUMMARY OF THE INVENTION

Accordingly, it is an object of the present invention to provide a cell structure of a ferroelectric memory device which can prevent a data from being lost, and improve a data read/write speed.

In order to achieve the above-described object of the present invention, there is provided a cell structure of a ferroelectric memory device including: first and second MOS transistors connected in series between two bit lines, and performing a switching operation according to an enable state of a word line; a third MOS transistor connected between the first and second MOS transistors and a plate line, and engaged with the first and second MOS transistors according to an enable state of the word line; and first and second ferroelectric capacitors connected between the first MOS transistor and the third MOS transistor, and between the second MOS transistor and the third MOS transistor, respectively, and storing data in accordance with a switching state of the first to third MOS transistors.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A cell structure of a ferroelectric memory device in accordance with a preferred embodiment of the present invention will now be explained in detail with reference to the accompanying drawings.

Figure 5:
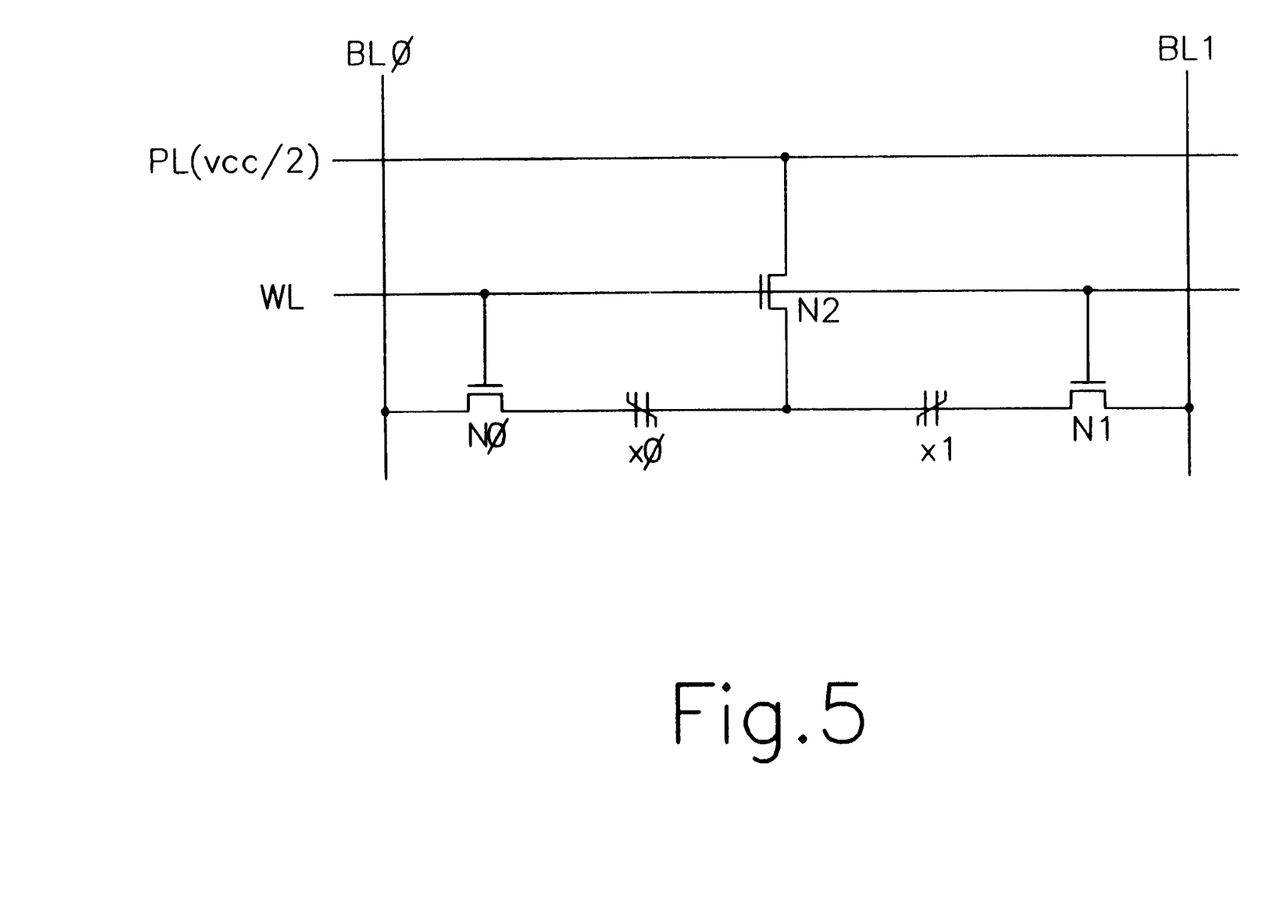
FIG. 5 is a circuit view illustrating a cell structure of a ferroelectric memory device in accordance with a preferred embodiment of the present invention.

FIG. 5 is a circuit view illustrating the cell structure of the ferroelectric memory device in accordance with the preferred embodiment of the present invention. The cell structure consists of two cells by using three MOS transistors N0, N1, N2 and two ferroelectric capacitors X0, X1.

That is, first and second MOS transistors N0, N1 (NMOS transistors) are connected in series between two bit lines BL0, BL1. Gates of the first and second MOS transistors N0, N1 are connected to a word line WL, and turned on when a high-level voltage (approximately, Vcc+Vt) is applied to the word line WL.

A third MOS transistor N2 (NMOS transistor) is connected between the first and second MOS transistors N0, N1 and a plate line PL. A gate of the third NMOS transistor N2 is connected to the word line WL. The third MOS transistor N2 is turned on when the high level voltage (approximately, Vcc+Vt) is applied to the word line WL.

On the other hand, a source of the first MOS transistor N0 is connected to an upper electrode of the first ferroelectric capacitor X0, a source of the second MOS transistor N1 is connected to an upper electrode of the second ferroelectric capacitor X1, and lower electrodes of the first ferroelectric capacitor X0 and the second ferroelectric capacitor X1 are connected to each other, and thus connected to a drain of the third MOS transistor N2. A source of the third MOS transistor N2 is connected to the plate line PL providing a voltage of Vcc/2.

Figure 6:
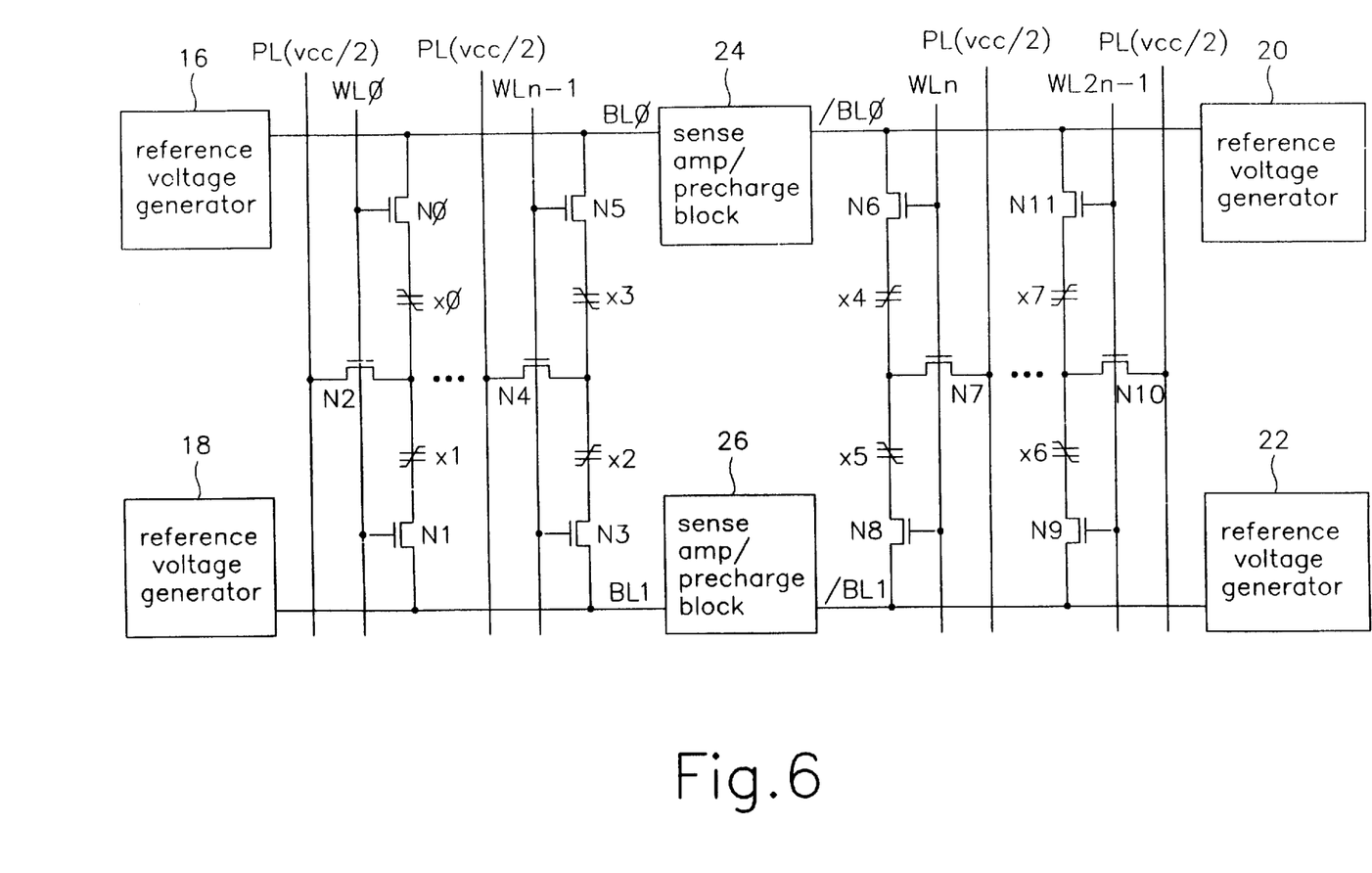
FIG. 6 is a circuit view illustrating a state where the cell structure of the ferroelectric memory device in FIG. 5 is employed.

In the case that the cell structure of the ferroelectric memory device in accordance with the preferred embodiment of the present invention is applied to a cell array having n cells, it has an open bit line structure between reference voltage generators 16~22 and sense amp./precharge blocks 24, 26 as shown in FIG. 6.

Figure 7:
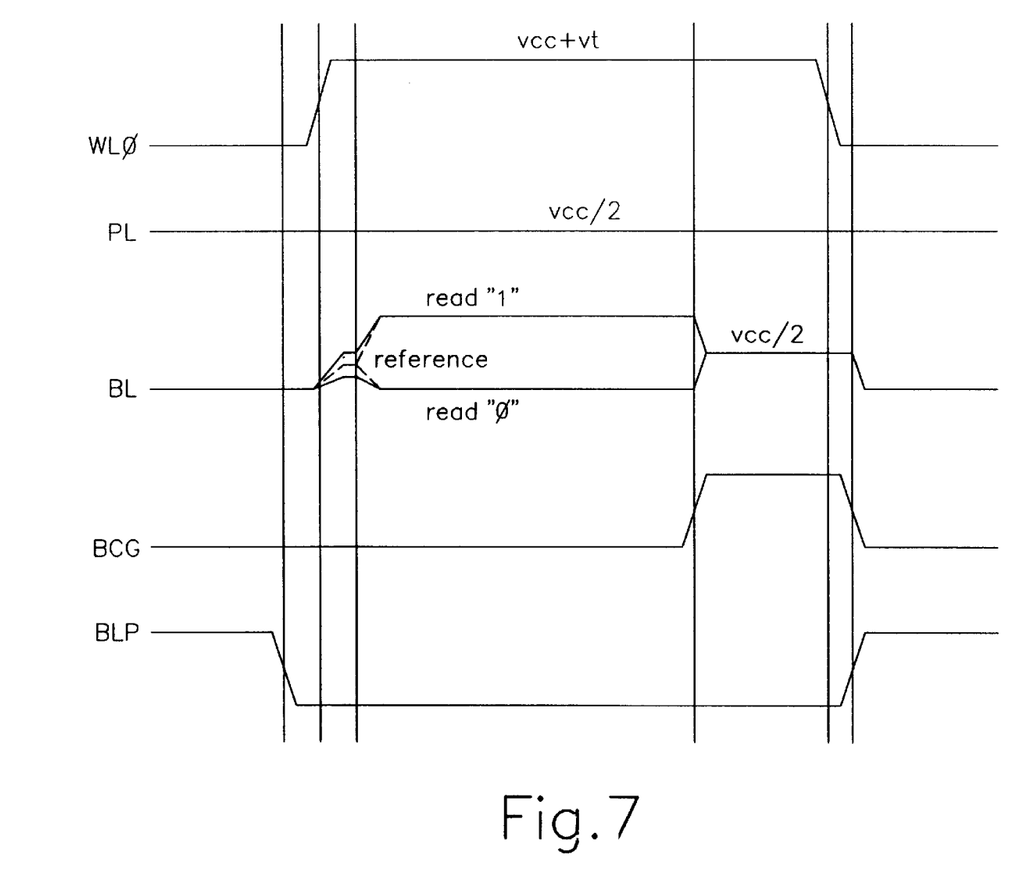
FIG. 7 is a timing view of the circuit as shown in FIG. 6.

The operation of the cell structure of the ferroelectric memory device in accordance with the preferred embodiment of the present invention will now be described with reference to FIG. 7.

First, the bit lines BL0, BL1 are precharged at a low level L according to a bit line precharge signal BLP from the sense amp./precharge blocks 24, 26. When the bit line precharge signal BLP is transited from high to low, the bit lines BL0, BL1 are floated. Here, a word line WL0 is selected, and a voltage of Vcc+Vt is applied to the word line WL0. Accordingly, the first to third MOS transistors N0, N1, N2 are turned on, and the voltage of Vcc/2 from the plate line PL is applied to the lower electrodes of the first and second ferroelectric capacitors X0, X1. As a result, the data of the first and second ferroelectric capacitors X0, X1 are applied to the bit lines BL0, BL1, and sensed/amplified with the reference voltage.

In order to restore the data after being amplified to a low or high level, when a bit line half Vcc precharge signal BCG from the sense amp./precharge blocks 24, 26 is driven at a high level, the bit lines BL0, BL1 are precharged to Vcc/2, both end portions of the first and second ferroelectric capacitors X0, X1 become the voltage of Vcc/2, and thus the data are restored. Thereafter, in case the word line WL0 becomes a low level, both end portions of the first and second ferroelectric capacitors X0, X1 are floated, thereby maintaining the data.

The above-described cell structure of the ferroelectric memory device can perform a high-speed data sensing operation and a restoring operation, identically to the conventional ferroelectric memory cell as shown in FIG. 4 and prevent the data from being lost when the word line is transited from an enable state to a disable state.

As discussed earlier, the cell structure for the ferroelectric memory device in accordance with the present invention can carry out the high-speed data sensing operation and the restoring operation, and prevent a data loss, thereby improving speed and reliability.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A cell structure of a ferroelectric memory device, comprising:

first and second MOS transistors connected in series between two bit lines, for performing a switching operation according to an enable state of a word line, wherein each gate of the first and second MOS transistors is commonly connected to the word line;

a third MOS transistor connected between a plate line and a contact point of the first MOS transistor and the second MOS transistor, for engaging with the first and second MOS transistors according to an enable state of the word line, wherein a gate of said third MOS transistor is connected to the word line; and first and second ferroelectric capacitors connected between the first MOS transistor and the third MOS transistor, and between the second MOS transistor and the third MOS transistor, respectively, and storing data in accordance with a switching state of the first to third MOS transistors.

2. The cell structure according to claim 1, wherein when the first to third MOS transistors and the first and second ferroelectric capacitors are applied to a cell array having a plurality of cells, they constitute an open bit line structure.

3. The cell structure according to claim 1, wherein the first to third MOS transistors are NMOS transistors.

4. The cell structure according to claim 3, wherein a drain of the third MOS transistor is connected to lower electrodes of the first and second ferroelectric capacitor.

5. The cell structure according to claim 1, wherein the plate line is connected to the third MOS transistor, and precharged to a half of a power voltage.

6. The cell structure according to claim 1, wherein when the word line is enabled, the data stored in the first and second ferroelectric capacitors are senses/amplified, and then the sensed/amplified data are restored in the first and second ferroelectric capacitors, and when the word line is disabled, both end portions of the first and second ferroelectric capacitors are floated, and the sensed/amplified data are maintained.

7. A cell structure of a ferroelectric memory device, comprising:

first and second MOS transistors connected in series between two bit lines, and performing a switching operation according to an enable state of a word line;

a third MOS transistor connected between the first and second MOS transistors and a plate line, and engaged with the first and second MOS transistors according to an enable state of the word line;

first and second ferroelectric capacitors connected between the first MOS transistor and the third MOS transistor, and between the second MOS transistor and the third MOS transistor, respectively, and storing data in accordance with a switching state of the first to third MOS transistors;

wherein the first to third MOS transistors are NMOS transistors; and a drain of the third MOS transistor is connected to lower electrodes of the first and second ferroelectric capacitor; and a half of a power voltage is provided to said plate line connected to the third MOS transistor; and wherein after a data sensing/amplifying operation is performed while the word line is enabled, and the data are restored in the first and second ferroelectric capacitors, when the word line is disabled, both end portions of the first and second ferroelectric capacitors are floated, and the data are maintained.

* * * * *

UNITED STATES PATENT AND TRADEMARK OFFICE
CERTIFICATE OF CORRECTION

PATENT NO. : 6,215,691 B1
DATED : April 10, 2001
INVENTOR(S) : Duck Ju Kim, Je Hoon Park It is certified that error appears in the above-identified patent and that said Letters Patent is hereby corrected as shown below:

Claim 6,
Line 3, change "senses/amplified" to -- sensed/amplified --.

Signed and Sealed this

Thirtieth Day of October, 2001

Attest:

NICHOLAS P. GODICI
Attesting Officer  Acting Director of the United States Patent and Trademark Office